United States Patent [19]

Gray et al.

[11] Patent Number: 4,689,500

[45] Date of Patent: Aug. 25, 1987

[54] COMPARATOR WITH SUBSTRATE INJECTION PROTECTION

[75] Inventors: Randall C. Gray, Tempe, Ariz.; Robert M. Hess, Roselle, Ill.; Robert B. Jarrett, Tempe, Ariz.; Edward E. Li, Roselle, Ill.

[73] Assignee: Motorola, Inc., Schaumburg, Ill.

[21] Appl. No.: 864,368

[22] Filed: May 19, 1986

[51] Int. Cl.[4] .................. H03K 5/153; H03K 5/24
[52] U.S. Cl. .................... 307/362; 307/491; 307/494
[58] Field of Search .......... 307/303, 355, 356, 362, 307/491, 494

[56] References Cited

U.S. PATENT DOCUMENTS 3,213,293 10/1965 Finlon et al. .................. 307/362
4,418,290 11/1983 Nagano ........................ 307/362

Primary Examiner—John Zazworsky
Attorney, Agent, or Firm—Vincent B. Ingrassia

[57] ABSTRACT

An improved comparator circuit of the type which includes first and second differential PNP transistors operating in conjunction with a current mirror circuit includes an additional dual collector PNP transistor. That is, while the reference voltage is applied to the base of one of the differential transistors, the input voltage to be compared with the reference voltage applied to the emitter of the dual collector's transistor which has a first collector coupled to the base of the other differential transistor. The second collector is coupled to the base of the additional transistor. In this manner, should the input voltage fall below the substrate voltage, the additional transistor will be reverse biased thus preventing the parasitic diode at the base of the second differential transistor from turning on.

7 Claims, 1 Drawing Figure

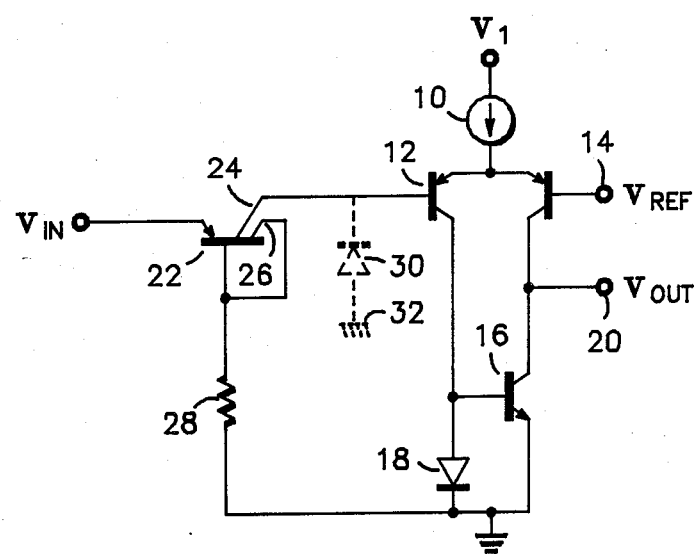

COMPARATOR WITH SUBSTRATE INJECTION PROTECTION

BACKGROUND OF THE INVENTION

This invention relates generally to integrated comparator circuits, and more particularly to a comparator circuit which prevents substrate injection when the input voltage falls below substrate ground.

A well known comparator circuit includes first and second differential input transistors for use in conjunction with a current mirror circuit. The base terminal of the first transistor is typically coupled to receive a reference voltage ($V_{REF}$) while the base terminal of the second transistor is coupled to receive an input voltage ($V_{IN}$). The state of the comparator's output then depends on the relative magnitudes of $V_{REF}$ and $V_{IN}$.

Such comparator circuits are commonly implemented in epitaxial wells (e.g. N-type) formed on a semiconductive substrate (e.g. P-type). If the input transistors are lateral PNP transistors, a parasitic diode exists between the substrate and the base epitaxial region. Should $V_{IN}$ fall below the substrate ground, as is possible in many automotive applications, the parasitic diode becomes forward biased resulting in substrate injection; i.e. current being pulled from another epitaxial island (epi-island). If this epi-island contained a sensitive logic node, the unwanted substrate injection could result in an improper logic state.

SUMMARY OF THE INVENTION

It is an object of the present invention to provide an improved comparator circuit.

It is a further object of the present invention to provide an improved comparator circuit for use in automotive applications.

It is a still further object of the present invention to provide a monolithically integrable comparator circuit which prevents substrate injection when the input voltage falls below substrate ground.

According to a broad aspect of the invention there is provided a comparator circuit comprising comparator means having first and second inputs and an output, the first input coupled to receive a reference signal. Switching means is provided which has a first terminal coupled to the second input and a second terminal coupled to receive an input signal for comparison with said reference signal. The switching means acts as a low impedance when the input signal is above a predetermined value, and acts as a high impedance when the input signal is below the predetermined value.

BRIEF DESCRIPTION OF THE DRAWING

The above and other objects, features and advantages of the present invention will be more clearly understood from the following detailed description taken in conjunction with the accompanying drawing which is a schematic diagram of the inventive comparator circuit.

DESCRIPTION OF THE PREFERRED EMBODIMENT

Referring to the drawing, current source 10, PNP transistors 12 and 14, NPN transistor 16 and diode 18 comprise a well known comparator circuit. As can be seen, current source 10 is coupled between a source of supply voltage ($V_1$) and the emitters of transistors 12 and 14. The collector of transistor 12 is coupled to the anode of diode 18 and to the base of transistor 16. Both the cathode of diode 18 and the emitter of transistor 16 are coupled to ground. The collector of transistor 14 is coupled to the collector of transistor 16 and to output terminal 20 at which an output signal ($V_{OUT}$) is produced. The base of transistor 14 is coupled to a reference voltage ($V_{REF}$), and the base of transistor 12 is coupled via a dual collector PNP transistor 22 to an input voltage $V_{IN}$ which is to be compared with $V_{REF}$.

Transistor 22 has an emitter coupled to receive $V_{IN}$ and a first collector 24 coupled to the base of transistor 12. The base of transistor 22 is coupled to a second collector 26 and, via resistor 28, to ground. In order to explain the inventive circuits, it will be first assumed that the input voltage $V_{IN}$ is applied directly to the base of transistor 12 and that input transistor 22 is not in the circuit. In this case, the well known comparator circuit operates as expected. That is, if $V_{REF}$ exceeds $V_{IN}$, transistor 12 will turn on harder than transistor 14. The current mirror comprised of diode 18 and transistor 16 will attempt to produce at the collector of transistor 16 the same current flowing in the collector of transistor 12. Thus, the output voltage $V_{OUT}$ at terminal 20 will fall.

If, on the other hand, $V_{IN}$ exceeds $V_{REF}$, the current flowing in the collector of transistor 14 will exceed that flowing in the collector of transistor 12. Since the current mirror circuit will cause only the current flowing in the collector of transistor 12 to flow in the collector of transistor 16, the output voltage $V_{OUT}$ at terminal 20 will rise.

As stated previously, the problem associated with this well known approach results from the existence of a parasitic diode 30 (shown dotted) having an anode coupled to substrate ground 32 and a cathode coupled to the base of differential input transistor 12. If the base of transistor 12 were permitted to fall below substrate ground, parasitic diode 30 would become forward biased resulting in the above referred to unwanted substrate injection. This problem is avoided by the inclusion of dual collector PNP transistor 22 between the base of transistor 12 and the source of the input voltage $V_{IN}$ which acts as (i) a low impedance when $V_{IN}$ exceeds substrate ground, and (ii) a high impedance when $V_{IN}$ is less than substrate ground.

As should now be appreciated, should $V_{IN}$ fall too low, the emitter junction of transistor 22 becomes reverse biased. Therefore, in this case, transistor 22 acts as a high impedance preventing the base of transistor 12 from falling low enough to forward bias parasitic diode 30. When the input voltage $V_{IN}$ goes high, transistor 22 becomes forward biased and, due to the fact that collector 26 of transistor 22 is folded back to its base, transistor 22 acts as a current mirror. Collector 26 takes a portion of the input current and applies it to resistor 28. Folded back collector 26 effectively controls the current gain of transistor 22 allowing $V_{IN}$ to rise above $V_{REF}$ when driven from current source inputs. If not folded back, high current gain devices would effectively clamp the $V_{IN}$ node to one base-emitter voltage above resistor 28. Collector 24 of transistor 22 saturates and acts as a low impedance switch to $V_{IN}$. The comparator will trip when the input voltage $V_{IN}$ minus the saturation voltage at transistor 22 ($V_{SAT}$) equals the reference voltage $V_{REF}$.

When $V_{IN}$ falls sufficiently to cause the voltage at the base of transistor 12 to be below the reference voltage, collector 24 acts as an emitter for discharging stored charge at the base of transistor 12.

The above description is given by way of example only. Changes in form and details may be made by one skilled in the art without departing from the scope of the invention as defined by the appended claims.

What is claimed is:

1. A comparator circuit comprising:
    comparator means having first and second inputs and an output, said first input coupled to receive a reference signal; and
    switching means having a first terminal coupled to said second input and a second terminal coupled to receive an input signal for comparison with said reference signal, said switching means for acting as a low impedance when said input signal is above a predetermined value, and for acting as a high impedance when said input signal is below said predetermined value, said switching means comprising a first transistor having an emitter for receiving said input signal, a base for coupling to a first source of supply voltage, a first collector coupled to said second input and a second collector coupled to its base.

2. A comparator circuit according to claim 1 wherein said first transistor is a PNP transistor.

3. A comparator circuit according to claim 1 further comprising resistive means coupled between the base of said first transistor and said first source of supply voltage.

4. A comparator circuit according to claim 3 wherein said comparator means comprises:
    current mirror means; and
    second and third PNP transistors each having base, emitter and collector terminals, the emitter terminals of each of said second and third PNP transistors being coupled together and to a second source of supply voltage, the collector terminals of said second and third transistors being coupled to said current mirror means, the base of said second PNP transistor forming said first input and the base of said third PNP transistor forming said second input.

5. An improved comparator circuit of the type wherein first and second differentially coupled transistors each having base electrodes operate in conjunction with a current mirror circuit to provide an output indicative of whether an input signal is greater or less than a reference signal, the reference signal being applied to the base electrode of said first transistor, the improvement comprising:
    switching means having a first terminal coupled to the base electrode of said second transistor and a second terminal coupled to receive an input signal for comparison with said reference signal, said switching means for acting as (i) a low impedance when said input signal is above a predetermined value and (ii) the high impedance when said input signal is below said predetermined value, said switching means comprising a third transistor having emitter forming said second terminal, a first collector forming said first terminal, and a base for coupling to a first source of supply voltage.

6. An improved comparator circuit according to claim 5 wherein said third transistor is a PNP transistor.

7. An improved comparator circuit according to claim 6 wherein said third transistor has a second collector coupled to its base.

* * * * *